United States Patent
Zarbock et al.

(10) Patent No.: US 9,570,883 B2
(45) Date of Patent: Feb. 14, 2017

(54) PHOTONIC PACKAGE ARCHITECTURE (75) Inventors: Edward A. Zarbock, Gilbery, AZ (US); Debendra Mallik, Chandler, AZ (US)

(73) Assignee: INTEL CORPORATION, Santa Clara, CA (US)

(*) Notice: Subject to any disclaimer, the term of this patent is extended or adjusted under 35 U.S.C. 154(b) by 64 days.

(21) Appl. No.: 13/976,419

(22) PCT Filed: Dec. 28, 2011

(86) PCT No.: PCT/US2011/067653
§ 371 (c)(1),
(2), (4) Date: Jun. 26, 2013

(87) PCT Pub. No.: WO2013/100995
PCT Pub. Date: Jul. 4, 2013

(65) Prior Publication Data
US 2014/0029639 A1    Jan. 30, 2014

(51) Int. Cl.
G02B 6/00 (2006.01)
G02B 27/00 (2006.01)
H01S 5/00 (2006.01)
H01L 25/16 (2006.01)
G02B 6/42 (2006.01)

(52) U.S. Cl.
CPC .......... *H01S 5/0071* (2013.01); *G02B 6/4214* (2013.01); *G02B 6/4238* (2013.01); *G02B 6/4269* (2013.01); *G02B 6/4274* (2013.01); *H01L 25/167* (2013.01); *G02B 6/4249* (2013.01); *H01L 2924/0002* (2013.01)

(58) Field of Classification Search
CPC .................................. G02B 6/00; G02B 27/00
USPC ............................................................ 385/93
See application file for complete search history.

(56) References Cited

U.S. PATENT DOCUMENTS

| | | | |
|---|---|---|---|
| 5,568,574 A * | 10/1996 | Tanguay et al. | 385/14 |
| 6,093,938 A | 7/2000 | Minemier et al. | |
| 6,229,158 B1 | 5/2001 | Minemier et al. | |
| 6,450,699 B1 | 9/2002 | Murali et al. | |
| 6,973,110 B2 | 12/2005 | Althaus et al. | |
| 7,239,767 B2 | 7/2007 | Kim et al. | |
| 7,271,461 B2 | 9/2007 | Dutta | |
| 7,324,716 B2 | 1/2008 | Epitaux | |

(Continued)

FOREIGN PATENT DOCUMENTS

| | | |
|---|---|---|
| CN | 102656493 | 9/2012 |
| KR | 20030007311 | 1/2003 |
| KR | 20060080236 | 7/2006 |

OTHER PUBLICATIONS

International Preliminary Report on Patentability (IPRP) for International Application No. PCT/US2011/067653, dated Jul. 10, 2014, 6 pp.

(Continued)

*Primary Examiner* — Kaveh C Kianni
(74) *Attorney, Agent, or Firm* — Konrad Raynes Davda & Victor LLP (57) ABSTRACT

A photonic package includes a photonic device having a photon emitter on the front side of the die. A beam of photons from the photon emitter passing from the front side to the backside of the die, passes through the substrate material of the die which is substantially transparent to the beam of photons, to the backside of the die. Other embodiments are also described.

11 Claims, 9 Drawing Sheets

(56) References Cited

U.S. PATENT DOCUMENTS

| | | | |
|---|---|---|---|
| 7,413,995 | B2 | 8/2008 | Sterrett et al. |
| 7,592,704 | B2 | 9/2009 | Sterrett et al. |
| 7,734,123 | B2 | 6/2010 | Bar et al. |
| 7,847,411 | B2 | 12/2010 | Takaike |
| 7,851,811 | B2 | 12/2010 | Dutta |
| 8,774,570 | B2 | 7/2014 | Choi |
| 8,865,489 | B2* | 10/2014 | Rogers et al. ............... 438/27 |
| 2003/0146017 | A1 | 8/2003 | Fan et al. |
| 2004/0008952 | A1* | 1/2004 | Kragl ........................... 385/88 |
| 2005/0100264 | A1 | 5/2005 | Kim et al. |
| 2005/0207458 | A1 | 9/2005 | Zheng |
| 2006/0093369 | A1* | 5/2006 | Nagarajan ................. 398/135 |
| 2007/0297713 | A1 | 12/2007 | Lu et al. |
| 2009/0180732 | A1* | 7/2009 | Takai et al. .................. 385/14 |
| 2010/0006784 | A1* | 1/2010 | Mack et al. ................ 250/551 |
| 2010/0111473 | A1* | 5/2010 | Pinguet et al. .............. 385/37 |
| 2010/0151614 | A1 | 6/2010 | Darbinyan et al. |
| 2011/0019960 | A1 | 1/2011 | Matsubara et al. |
| 2011/0044367 | A1 | 2/2011 | Budd et al. |
| 2012/0099820 | A1* | 4/2012 | Rolston et al. ............. 385/59 |
| 2013/0279844 | A1* | 10/2013 | Na et al. ...................... 385/14 |
| 2014/0091349 | A1* | 4/2014 | Diana et al. ................ 257/98 |
| 2014/0092576 | A1 | 4/2014 | Lucero et al. |

OTHER PUBLICATIONS

Denselight Semiconductors, "Uncooled High Power Semiconductor Laser Diode", DL-UCS/UPS/UPM Series, Document No. 317-09-1401, retrieved on Dec. 6, 2011, 2011, 2 pp.

Innovative Photonic Solutions, "The IPS Standard 14-Pin Butterfly Package", [online], [retrieved on Dec. 7, 2011], retrieved from the Internet at <URL: http://www.innovativephotonics.com/14-Pin_BF.htm>, 1 pp.

Intel Corporation, "Intel Research—Photonics", retrieved on Dec. 6, 2011, 4 pp.

Myslewski, R., "Intel Unfurls Copper-Killing Optical Cables", [online], Sep. 23, 2009, [retrieved on Dec. 6, 2011], retrieved from the Internet at <URL: http://www.theregister.co.uk/2009/09/23/light_peak/., 2 pp.

Thorlabs, Inc., "Butterfly Laser Diode Mount", LM14S2, Operating Manual, Feb. 20, 2009, 15 pp.

Thorlabs, Inc., "Butterfly Laser Diode Mounts"[online], Updated May 6, 2009, [retrieved on Dec. 6, 2011], retrieved from the Internet at <URL: http://www.thorlabs.de/NewGroupPage9.cfm?ObjectGroup_ID=1558>, 2 pp.

Wikipedia, "Hybrid Silicon Laser", [online], Updated May 19, 2010, [retrieved Dec. 6, 2011], Retrieved from the Internet at <URL: http://en.wikipedia.org/w/index.php?oldid=362912178>, 3 pp.

Wikipedia, "Optical Interconnect", [online], Updated Oct. 22, 2011, [retrieved Dec. 6, 2011], Retrieved from the Internet at <URL: http://en.wikipedia.org/w/index.php?oldid=456894125>, 2 pp.

Wikipedia, "Silicon Photonics", [online], Updated Nov. 29, 2011, [retrieved Dec. 6, 2011], Retrieved from the Internet at <URL: http://en.wikipedia.org/w/index.php?oldid=463171777>, 7 pp.

International Search Report and Written Opinion for International Application No. PCT/US2011/067653, dated Jul. 16, 2012, 9 pp.

Intel Corporation, "Introduction", 1999 Packaging Databook, Chapter 1, 18 pp.

Intel Corporation, "Introduction", 2000 Packaging Databook, Chapter 12, 34 pp.

Networking & Multimedia Group, "Manufacturing with the Land Grid Array Package", Freescale Semiconductor, Inc., Application Note, Document No. AN2920, Rev. 2, Dec. 2008, 16 pp.

Wikipedia, "Ball Grid Array", [online], last modified Aug. 26, 2012, [retrieved on Sep. 5, 2012], retrieved from the Internet at <URL: http://en.wikipedia.org/wiki/Ball_grid_array>, 5 pp.

Wikipedia, "Polyimide", [online], last modified Jul. 19, 2012, [retrieved on Sep. 16, 2012], retrieved from the Internet at <URL: http://en.wikipedia.org/wiki/Polyimide>, 3 pp.

U.S. Pat. No. 7,847,411, dated Dec. 7, 2010, is an English Language Equivalent of KR Publication No. 20060080236, dated Jul. 7, 2006.

International Search Report for International Application No. PCT/US2013/048371, dated Sep. 30, 2013, 3 pp.

Written Opinion for International Application No. PCT/US2013/048371, dated Sep. 30, 2013, 6 pp.

International Preliminary Report on Patentability for International Application No. PCT/US2013/048371, dated Apr. 9, 2015, 8 pp.

Restriction Requirement for U.S. Appl. No. 13/631,814, dated Mar. 26, 2015, 6 pp.

Response to Restriction Requirement for U.S. Appl. No. 13/631,814, dated May 26, 2015, 12 pp.

Office Action 1 for U.S. Appl. No. 13/631,814, dated Sep. 11, 2015, 29 pp.

Response to Office Action 1 for U.S. Appl. No. 13/631,814, dated Dec. 11, 2015, 29 pp.

Office Action 1 for CN Application No. 201380004552.3, dated May 3, 2016, 9 pp.

U.S. Pat. No. 8,774,570, dated Jul. 8, 2014, is an English language equivalent of CN Publication No. 102656493, dated Sep. 5, 2012.

Collins English Dictionary, "Printed Circuit Board", [online], [Retrieved on Mar. 21, 2016], Retrieved from the Internet at URL: <http://www.collinsdictionary.com/dictionary/english/printed-circuit-board>, 3 pp.

Wikipedia, "Interposer", [online], last modified Jun. 7, 2015, [Retrieved on Mar. 21, 2016], Retrieved from the Internet at URL: <https://en.wikipedia.org/wiki/Interposer>, 2 pp.

Final Office Action 1 for U.S. Appl. No. 13/631,814, dated Mar. 31, 2016, 20 pp.

Response to Final Office Action 1 for U.S. Appl. No. 13/631,814, dated Jun. 1, 2016, 10 pp.

Office Action 1 for CN Application No. 201380004552.3, dated May 3, 2016, 13 pp. (English Translation).

Notice of Allowance 1 for U.S. Appl. No. 13/631,814, dated Jul. 1, 2016, 13 pp.

* cited by examiner

PHOTONIC PACKAGE ARCHITECTURE

BACKGROUND

Description of Related Art

Electronic components are frequently placed on a shared substrate in multi-chip modules ("MCM"). By packing a number of semiconductor devices in close proximity to each other, individual packages for each of the devices may be eliminated. Furthermore, electrical performance is often improved, and board space and cost may be reduced.

In a conventional MCM, the devices are connected to a substrate and the electrical connection among the devices may be accomplished within the substrate, which may also be an integral part of the MCM package. One of the technologies used to connect the devices to the substrate is called flip chip or control collapse chip connection ("C4"). With this technology, solder bumps are reflowed to make connection to the terminal pads on the substrate.

Photonic components, such as, but not limited to, photon emitters such as laser transmitters, photon detectors such as laser receivers, array waveguides, amplifiers, couplers, splitters, and other devices for carrying light-based ("photonic") signals have often been manufactured using a different process than that for silicon based semiconductors. Thus, electronic components and photonic components have been manufactured on separate substrates using different processes and then interfaced together. However, more recently, advances have been made in fabricating photonic devices using manufacturing processes designed for silicon based semiconductors.

Active opto-electronic modules such as 10 Gb/s laser transmitters and receivers have been produced in so-called "butterfly packages." The butterfly package containing the laser device may be mounted in a heat sink which may include a thermoelectric cooler (TEC). Another packaging standard for photonic devices is known as a TO (Transistor Outline) can package leveraged from existing technology from lower data rate (1-2 Gbs) equipment.

Figure 1:
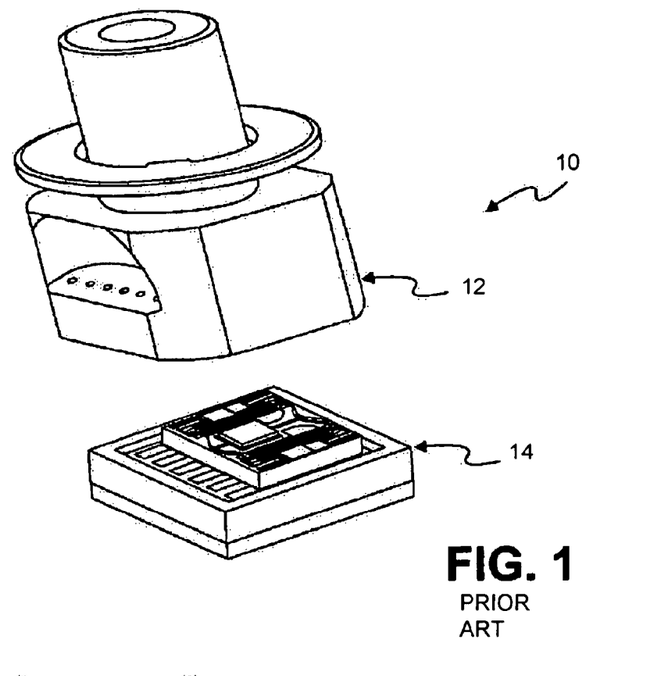
FIG. 1 schematically illustrates an assembly including a prior art opto-electronic module including a prior art opto-electronic package.

FIG. 1 illustrates an optical assembly 10 of another opto-electronic module, which includes a multi-layer opto-electronic package 14 and a receptacle 12 that can be attached to the opto-electronic package 14. An optical fiber (not shown) may be attached to the receptacle 12, thus putting the photonic components in optical communication with other devices. The opto-electronic package 14 can be either a transmitter or a receiver, and can therefore transmit signals to or receive signals from other optical components.

Figure 2:
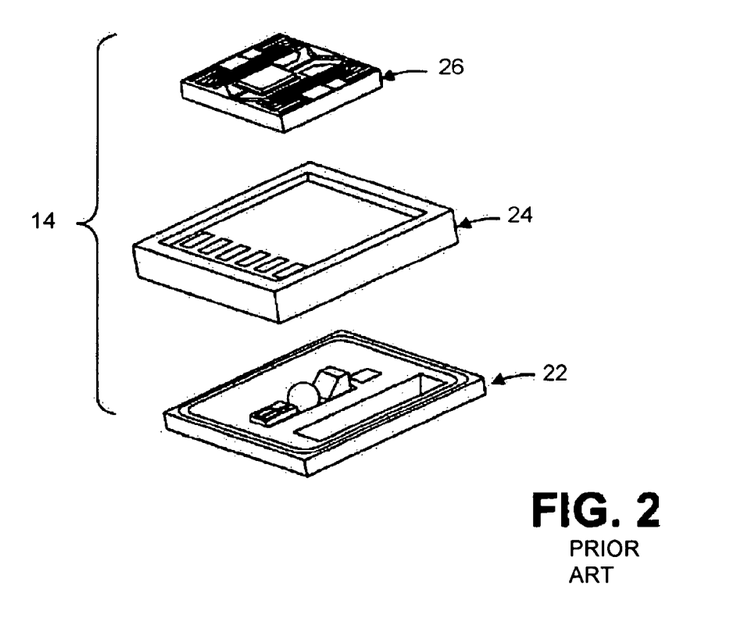
FIG. 2 is an exploded view of the prior art opto-electronic package of FIG. 1.

As shown in FIG. 2, the opto-electronic package 14 comprises a multi-layer stack including a base layer 22, a spacing layer 24 and an optical micro-electromechanical (MEMS) layer 26 comprising a MEMS microstage. The base layer 22 supports the entire package 14 and provides paths through which electrical signals and power can be delivered to photonic and other elements within the package. In addition, the base layer 22 provides a heat transfer path for heat generated within the package 14 to escape. Various photonic and electronic elements are positioned or formed thereon.

Figure 3:
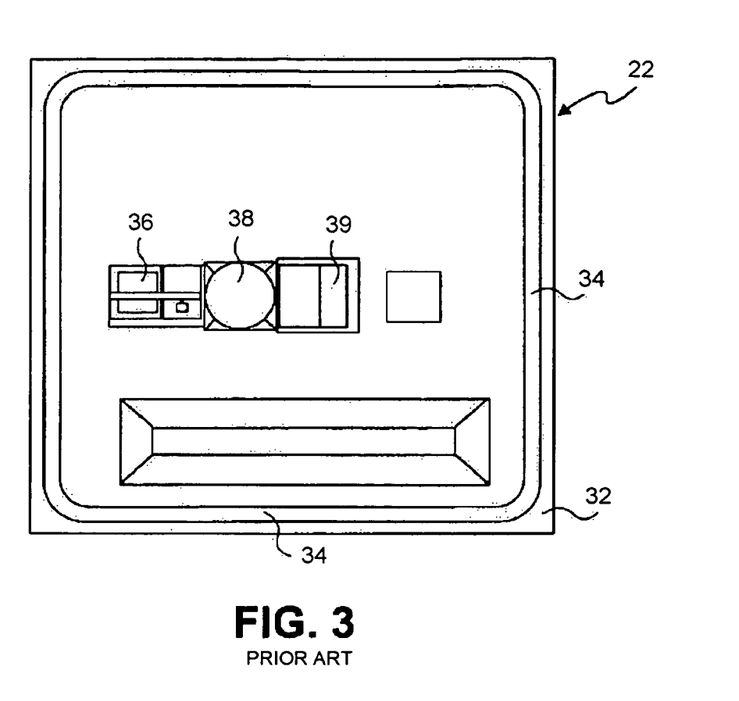
FIG. 3 is a plan view of the base layer of the opto-electronic package of FIG. 2.
Figure 4:
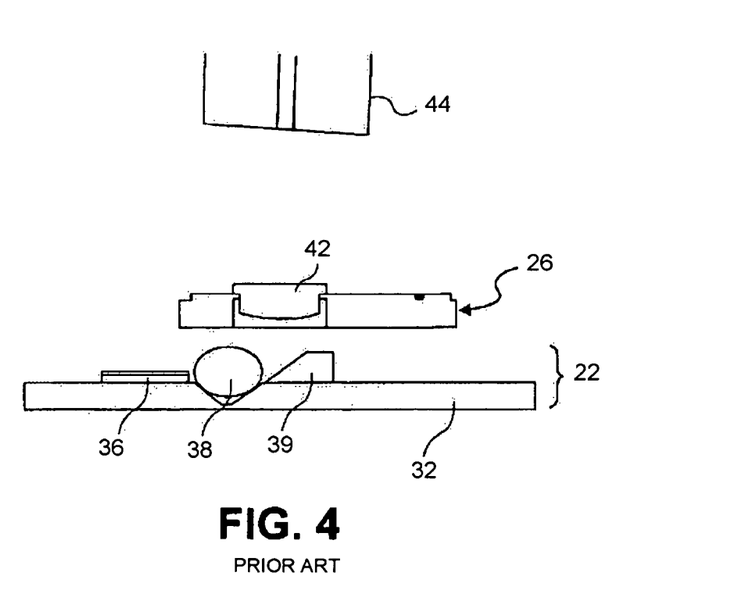
FIG. 4 is a cross-sectional view of the base layer of FIG. 3 illustrating the base layer as well as the positioning of an optical MEMs layer and an optical fiber relative to the base layer.

Referring to FIGS. 3 and 4, the base layer 22 is generally rectangular and is formed on a substrate 32 which may be made of silicon. An edge emitting laser diode 36 is attached on the substrate 32 and various other active or passive optical elements, such as lens 38 and turning mirror 39, are attached on the substrate to condition and direct a laser beam emanating from the laser diode 36. One or more wire-bonding pads (not shown) provide attachment points for wires to provide electrical power, electrical signals, or both, as the case may be, to the electronic and photonic components on, the base layer. The edge-emitting laser can be replaced with a vertical surface emitting laser (e.g., a VCSEL), in which case elements such as the turning mirror 39 can be omitted. A seal ring 34 of metal or other material is formed at or near the perimeter of the substrate 32, and allows for control of the spacing between the base layer 22 and the spacing layer 24, as well as to allow the base layer to form a hermetic seal with the spacing layer 24.

The laser diode 36 emits a laser beam in the direction of the lens 38 which collimates the beam exiting the laser and directs the collimated beam toward the turning mirror 39, which turns the collimated laser beam out of the plane of the base layer 22. The collimated beam is focused by the moveable optical element 42 such that it is launched into the end of an optical fiber 44.

The operation of the base layer 22 described above is characteristic of a transmitter, but a receiver can also be constructed in which the laser diode 36 is replaced with a photo-detector. The direction of the signal is reversed, such that a signal traveling through the fiber 44 is emitted from the fiber end and collimated by the moveable optical element 42. The collimated signal is then turned about 90 degrees by the turning mirror 39, and directed toward the optical element 38, which then focuses the incoming signal onto the photo-detector.

The spacing layer 24 is attached on top of the base layer 22, surrounds the photonic elements and provides hermeticity of the package. The spacing layer 24 also includes provisions such as electrical traces to provide signals and/or power to the optical MEMS layer 26.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

In one feature of the present description, an opto-electronic device such as a photonic package includes a photonic device having a die which passes a beam of photons between the front side and the backside of the die through the substrate material of the die which is substantially transparent to the beam of photons. As explained in greater detail below, such an arrangement can, in one embodiment, facilitate assembly of the components of the photonic package. For example, an optical coupler may be affixed to the backside of the die of the photonic device to pass the beam of photons between an optical cable coupled to the optical coupler and the photonic element or elements of the photonic device. In one embodiment, registration features may be provided on the optical coupler and the back side of the die of the photonic device to facilitate optical alignment of the photonic device and the optical coupler. In one aspect, an optically transparent adhesive may be used to affix the optical coupler to the backside of the die of the photonic device to facilitate passage of the beam of photons between the photonic device and the optical coupler.

In another aspect, a second die of an integrated circuit device containing integrated circuits such as driver circuits, may be electrically coupled to the front side of the die of the photonic device in a stacked arrangement to operate with integrated circuits and photonic elements of the photonic device. An interposer may be positioned on the front side of the photonic device to facilitate mechanical and electrical coupling of the stacked photonic and integrated circuit devices with a substrate such as a package substrate or a printed circuit board. In one aspect, the interposer provides a cavity of sufficient size to receive the second die in a space between the photonic device and the package or circuit board substrate.

In yet another aspect, a heat sink may be affixed to the back side of the die of the photonic device to draw heat from one or both of the photonic device and the integrated circuit device coupled to the front side of the photonic device. In one embodiment, the heat sink may define a cavity to receive and secure the optical coupler. In another aspect, registration features may be provided on the heat sink and the back side of the die of the photonic device to facilitate optical alignment of the photonic device and the optical coupler. In one embodiment, a thermally transmissive adhesive may be used to affix the heat sink to the backside of the die of the photonic device to facilitate passage of heat energy from the photonic device to the heat sink.

Figure 5:
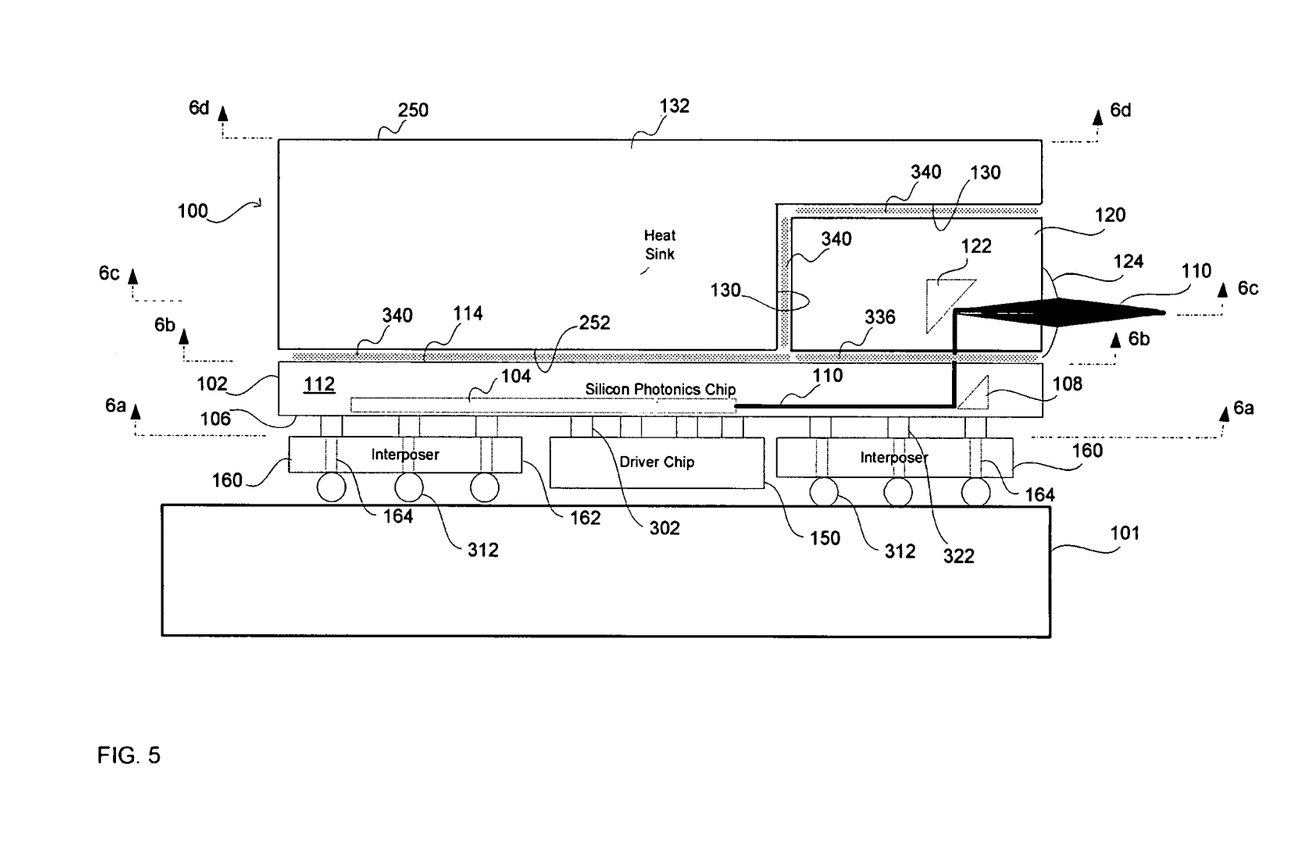
FIG. 5 is a schematic cross-sectional view of a photonic package in accordance with one embodiment of the present description.

FIG. 5 shows a photonic package 100 in accordance with one embodiment of the present description mounted on a substrate 101 which may be a substrate of a printed circuit or a substrate of another package, for example. The photonic package 100 includes a photonic die 102 which has one or more integrated photon emitters 104 such as a laser on the front side 106 of the die 102. Also integrated on the front side 106 of the die 102 is a mirror 108 which is positioned to reflect a beam of light 110 emitted from the photon emitter 104 through the body 112 of the die 102, to the back side 114 of the die 102. The semiconductor material of the body 112 of the die 102 is at least partially transparent to the wavelength emitted by the photon emitter 104. In the illustrated embodiment, the body 112 may be hundreds of microns thick. Other thicknesses may be used, depending upon the particular application.

Figure 6A:
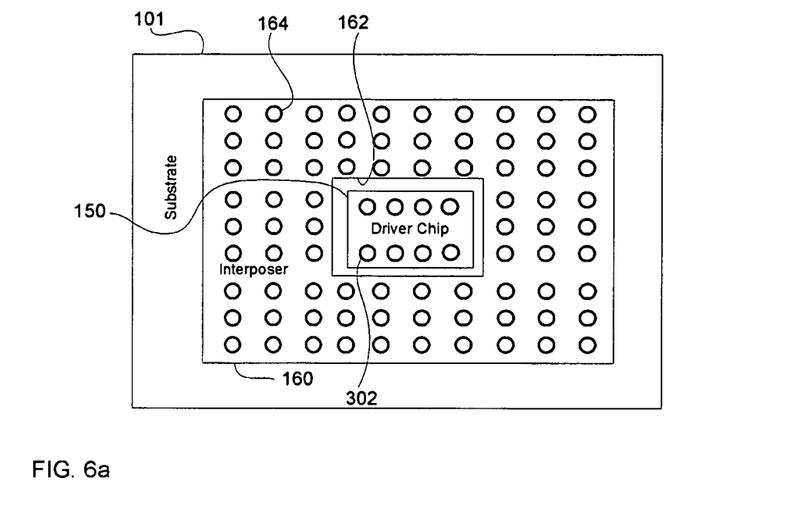
FIG. 6a is a cross-sectional view of the photonic package of FIG. 5 as viewed along the lines 6a-6a of FIG. 5.
Figure 6B:
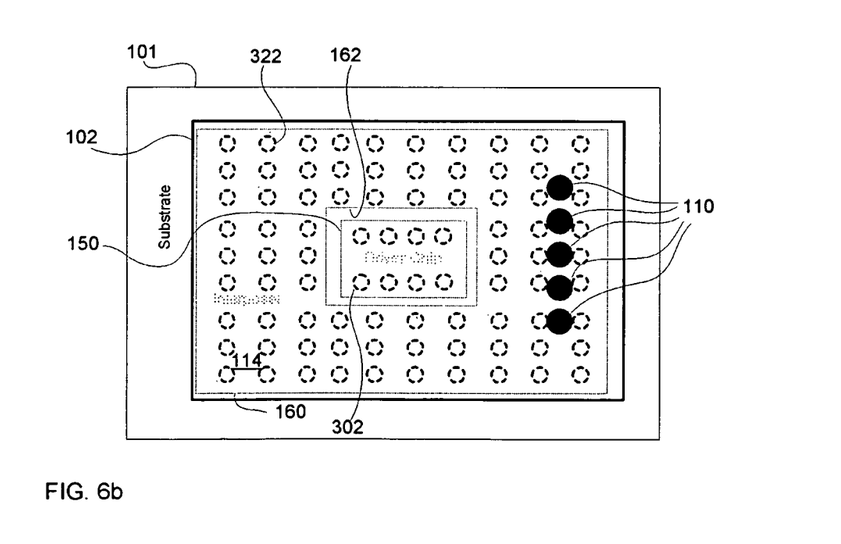
FIG. 6b is a cross-sectional view of the photonic package of FIG. 5 as viewed along the lines 6b-6b of FIG. 5.
Figure 6C:
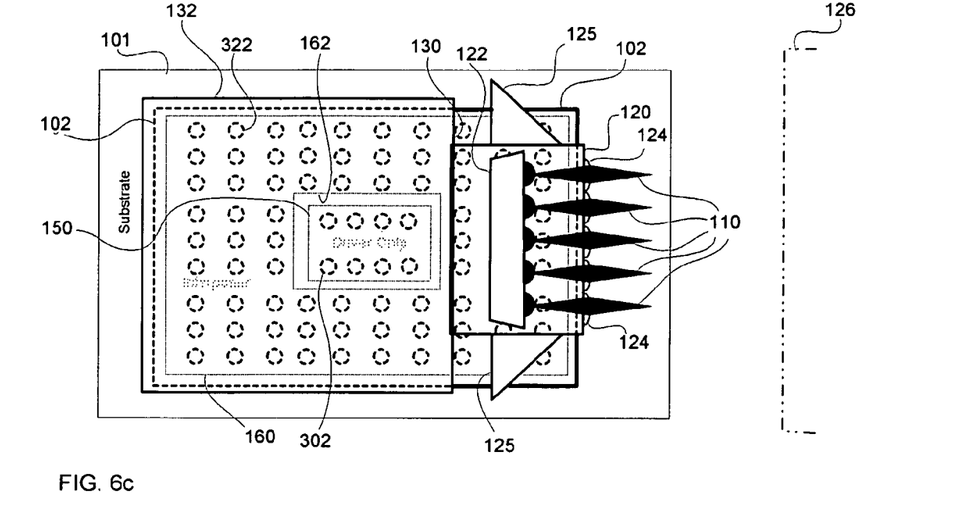
FIG. 6c is a cross-sectional view of the photonic package of FIG. 5 as viewed along the lines 6c-6c of FIG. 5.
Figure 6D:
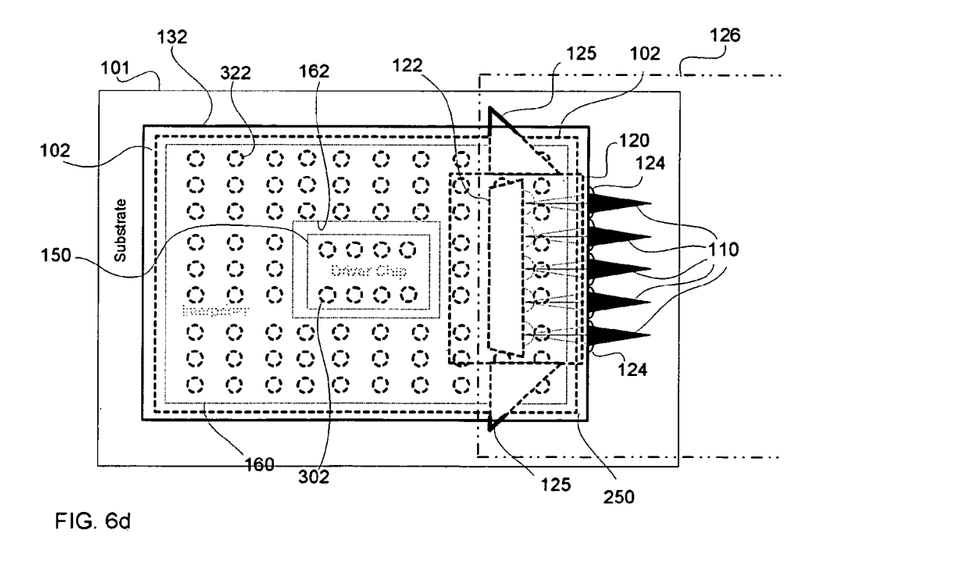
FIG. 6d is a cross-sectional view of the photonic package of FIG. 5 as viewed along the lines 6d-6d of FIG. 5.

FIG. 6a-6d are cross-sectional views of the stack of components of the package 102. In the illustrated embodiment, the photon emitter 104 emits five parallel beams 110 as shown in FIGS. 6b-6d. FIG. 6b, a cross-sectional view as viewed along the line 6b-6b of FIG. 5, depicts the five beams 110 emerging from the back side 114 of the photonic die 102. It is appreciated that one or more photon emitters 104 may emit a fewer or greater number of beams in a photonic device in accordance with the present description, depending upon the particular application.

As shown in FIG. 5 and FIG. 6c, a cross-sectional view as viewed along the line 6c-6c of FIG. 5, an optical coupler 120 affixed to the back side 114 of the die 102 includes a mirror 122 positioned to reflect the beams 110 emerging from the back side 114 of the die 102, to a plurality of lens 124 which focus the beams 110 to a fiber optic cable or other optical conduit 126 which may be coupled to the optical coupler 120 (FIG. 6d) using suitable releasable retention features 125. In another aspect of the present description, the optical coupler 120 may be received in a cavity 130 of a heat sink 132 which draws heat energy from the photonic die 102 and other integrated circuits of the package 100. In the illustrated embodiment, the package 100 includes a second die 150 bonded to the front side 106 of the photonic die 102. The second die 150 has integrated circuits including driver circuits for modulating the beam 110 emitted by the photon emitter 104. The die 150 may have other integrated circuits, depending upon the particular application.

In another aspect of the present description, an interposer 160 of the package 100, supports and spaces the photonic die 102 from the substrate 101 to provide sufficient vertical space between the photonic die 102 and the substrate 101 to permit the second die 150 to be bonded to the front side 106 of the photonic die 102 without interfering with the photonic die or the substrate 101. In addition, as best seen in FIG. 6a, a cross-sectional view as viewed along the lines 6a-6a of FIG. 5, the interposer 160 defines a cavity 162 which provides sufficient horizontal space within the interposer 160 to permit the second die 150 to be bonded to the front side of the photonic die 102 without interfering with the interposer 160.

The interposer 160 has internal conductors 164 which electrically connect the photonic die 102 to conductors of the substrate 101. The internal conductors 164 may be formed of conductive pins, conductive plugs, plated through holes and the like.

Figure 7:
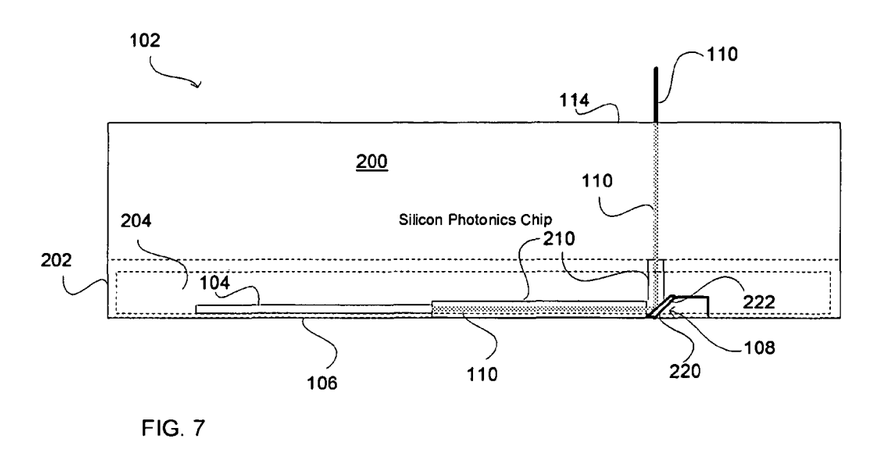
FIG. 7 is a schematic cross-sectional view of the photonic die of the photonic package of FIG. 5.
Figure 8:
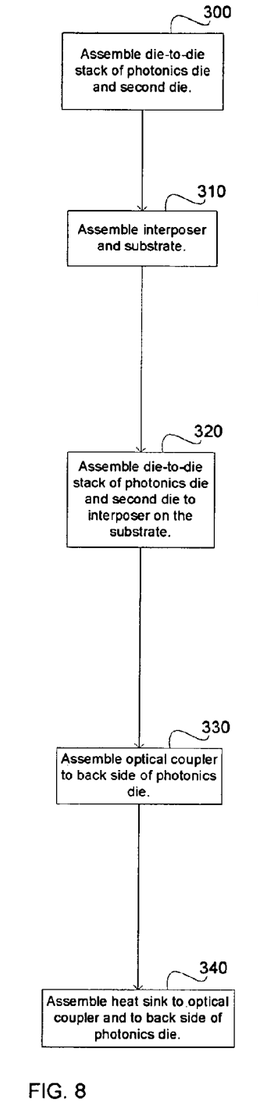
FIG. 8 illustrates operations in accordance with one embodiment for assembling a photonic package in accordance with the present description.

FIG. 7 shows one embodiment of the photonic die 102 in greater detail. The photonic die 102 includes a bulk region 200 which occupies the majority of the die 102. The bulk region 200 of this embodiment is cut from a silicon wafer but it is appreciated that other semiconductor materials may be used. However, it is preferred that the bulk region 200 be substantially transparent to the wavelengths emitted by a photon emitter 104 which in this embodiment, is a laser. In the illustrated embodiment, the photon emitter 104 emits light primarily in the infrared region of the spectrum such as 1.55 micrometers, for example. Other wavelengths may be used, depending upon the particular application.

Disposed on the bulk region 200 is an active layer 202 on the front side 106 of the die 102. The active layer includes integrated circuits 204 which include the photon emitter 104. The integrated circuits may be formed by doping suitable semiconductor regions in the active layer 202. Suitable integrated circuits may also be formed separately and bonded to the front side of the die 102.

In the illustrated embodiment, the photon emitter 104 may be an all silicon laser. It is appreciated that other photon emitter formation techniques may be used including silicon on insulator (SOI) or a hybrid silicon laser which is a semiconductor laser fabricated from both silicon and non-silicon materials such as group III-V semiconductor materials, for example. Other semiconductor materials and fabrication techniques may be used, depending upon the particular application. Also, although the beam source of the die 102 is described as a laser, it is appreciated that other photon emitters may be utilized, depending upon the particular application.

The active layer 202 of the die 102 may further include additional photonic structures 210 including suitable photonic waveguides to guide the beam from the photon emitter 104 to the bulk region 200 via the mirror 108. Although the photon emitter 104 is depicted as an edge emitting device, it is appreciated that the photon emitter 104 may be positioned to emit a beam vertically such that mirrors such as the mirror 108 may be eliminated in some applications. Thus, a beam may be emitted by a vertical photon emitter disposed on the front side 106 of the die 102 such that the emitted beam passes directly through the bulk region 200 to the backside 114 of the die 102, without first being reflected by a mirror such as the mirror 108 on the front side of the die 102.

The photonic structures 210 may include other photonic structures such as a modulator which modulates the beam 110 as driven by suitable driver circuits such as the driver circuits of the die 150, for example. The beam may be modulated to carry data to other devices via the optical coupler 120 and a suitable optical cable connected to the optical coupler 120. In some applications, the optical coupler 120 may be eliminated. For example, a die having a suitable photoreceptor may be affixed directly or indirectly to the backside 114 of the die 102 wherein the photoreceptor is positioned to receive the beam 110 from the die 102. In other applications, an optical cable may be affixed directly or indirectly to the backside 114 of the die 102 wherein the optical cable is positioned to receive the beam 110 from the die 102 and direct the beam to other devices of the system.

In the illustrated embodiment, the mirror 108 may be formed by etching a suitable beveled surface 220 in the active layer 202 at a suitable angle such as forty-five degrees, for example. Other angles may be provided depending upon the particular application.

The surface 220 may be plated with a suitable light reflective coating 222 such as a metallic coating. It is appreciated that other techniques may be used to form the mirror 108, depending upon the particular application. For example, the material of the active layer 202 may be sufficiently reflective such that a metallic or other reflective coating may be eliminated. In addition, other beveled surface formation techniques other than etching may be utilized as appropriate.

In the illustrated embodiment, the surface 220 is angled to reflect the beam 110 ninety degrees to redirect the beam 110 from parallel to the front side 106 to a direction transverse to the front side 106 so that the reflected beam is redirected to pass through the bulk region 200 and emerge from the backside 114 of the photonic die 102. It is appreciated that in other embodiments, the mirror surface 220 may be angled at other angles, depending upon the particular application.

The heat sink 132 (FIG. 5) may be made of any suitable material such as copper for example, which facilitates drawing heat energy from the dies 102 and 150 and radiating that heat energy away from the package 102. As shown in FIG. 5 and FIG. 6d, a cross-sectional view as viewed along the line 6d-6d of FIG. 5, a top surface 250 of the heat sink 132 may extend over substantially all of the backside 114 of the die 102 to facilitate radiating heat drawn from the dies 102 and 150. A bottom surface 252 (FIG. 5) of the heat sink 132 with the exception of the heat sink cavity 130 which receives the optical coupler 120, extends over and is in thermal contact with most of the backside 114 of the die 102 to facilitate drawing heat energy from the dies 102 and 150. In the illustrated embodiment, the heat sink bottom surface 252 covers those areas of the die 102 (and indirectly the die 150) which generate most of the heat energy.

FIG. 8 and FIGS. 9a-9e depict one embodiment of operations to assemble a photonic package such as the package 100 of the illustrated embodiment. In one operation, the photonic die such as the die 102 and a second die such as the driver circuit die 150 are assembled (block 300) in a die-to-die stack. In the illustrated embodiment, the stack of dies 102, 150 are in a "flip-chip" arrangement in which the front sides of the dies 102, 150 are facing each other. It is appreciated that a photonic die may be coupled to another die using other assembly techniques.

The contact pads or other electrical contact features on the front sides of the dies 102, 150 are aligned and bonded together using suitable bonding techniques. For example, the electrical contact features of the dies 102, 150 may be soldered using thermo-compression bonding as represented by the bonds 302 of FIG. 9a. The gap between the driver circuit die 150 and the photonic die 102 may optionally be under filled with a suitable under fill layer as appropriate for the particular application.

Figure 9A:
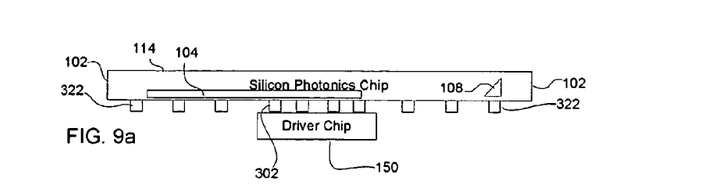
FIGS. 9a-9e are schematic cross-sectional diagrams illustrating the operations of FIG. 8 for assembling a photonic package in accordance with the present description.
Figure 9B:
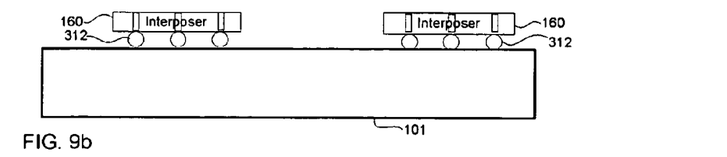

An interposer such as the interposer 160 may be assembled (block 310, FIG. 8) on a suitable substrate, such as the substrate 101 of FIG. 9b. The contact pads or other electrical contact features on the substrate 101 and the interposer 160 may be aligned and bonded together using suitable bonding techniques. For example, the electrical contact features of the interposer 160 and the substrate 101 may be soldered using thermo-compression bonding as represented by the bonds 312 of FIG. 9b. The gap between the substrate 101 and the interposer 160 may optionally be under filled with a suitable under fill layer as appropriate for the particular application.

Figure 9C:
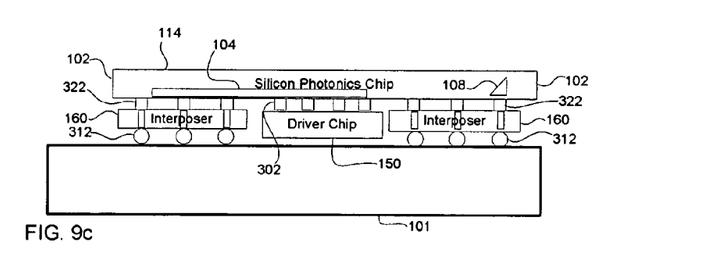

In another operation, the die-to-die stack of the photonic die 102 and the driver circuit die 150 may be assembled (block 320, FIG. 8) onto the interposer 160 on the substrate 101 as depicted in FIG. 9c. The contact pads or other electrical contact features on front side 106 of the photonic die 102 and the interposer 160 may be aligned and bonded together using suitable bonding techniques. For example, the electrical contact features of the interposer 160 and the die-to-die stack of the photonic die 102 and the driver circuit die 150 may be soldered using thermo-compression bonding as represented by the bonds 322 of FIG. 9*b*. The gap between the photonic die 102 and the interposer 160 may optionally be under filled with a suitable under fill layer as appropriate for the particular application.

Figure 9D:
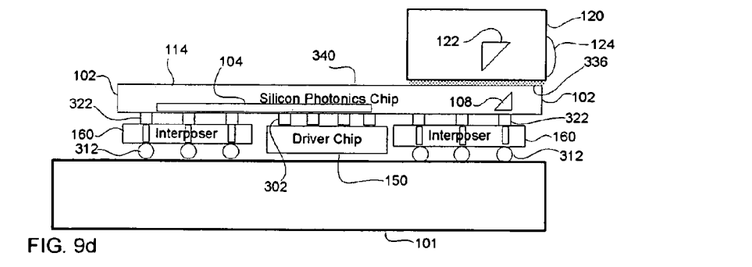
Figure 10:
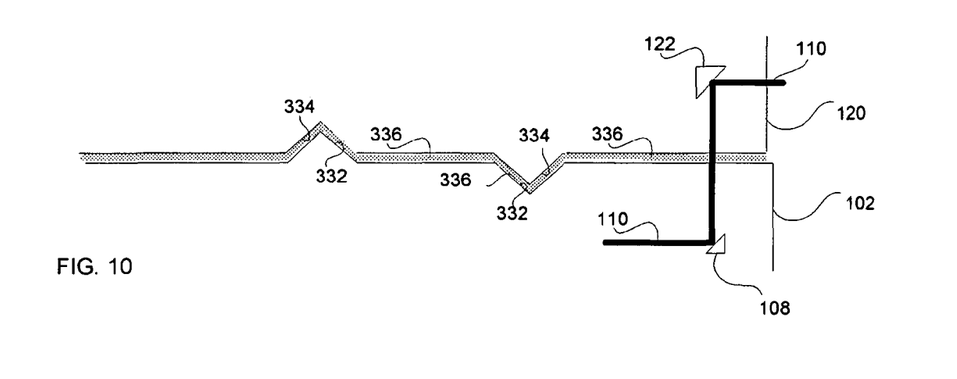
FIG. 10 illustrates one embodiment of registration and alignment features for a photonic package in accordance with the present description.
Figure 11:
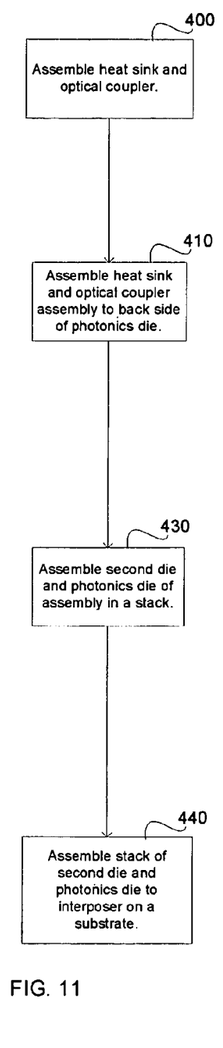
FIG. 11 illustrates operations in accordance with another embodiment for assembling a photonic package in accordance with the present description.

An optical coupler, such as the optical coupler 120 may be assembled (block 330, FIG. 8) to the back side 114 of the photonic die 102 as shown in FIG. 9*d*. The mirror 122 of the optical coupler 120 may be aligned with the mirror 108 of the photonic die 102 using suitable alignment techniques. For example, the optical coupler 120 and the back side 114 of the photonic die 102 may be aligned using registration features such as male and female beveled die features 332 (FIG. 10) carried on the back side 114 of the photonic die 102, which are aligned with and mated with corresponding male and female beveled features 334 on the optical coupler 120. In one embodiment, alignment features may have a size on the order of five microns, for example. Other sizes and other registration features may be utilized to align the optical coupler and the photonic die, depending upon the particular application.

As previously mentioned, the beam 110 passing through the body of the photonic die 102 emerges from the back side 114 of the photonic die 102 and passes into the optical coupler 120. In one aspect of the present description, an adhesive 336 which is substantially transparent to the wavelength or wavelengths of the beam 110 may be used to affix the optical coupler 120 to the back side 114 of the photonic die. It is appreciated that other techniques may be used to affix the optical coupler 120 to the back side 114 of the photonic die in such a manner to permit the beam 110 to be transmitted between the photonic die 102 and the optical coupler 120.

Figure 9E:
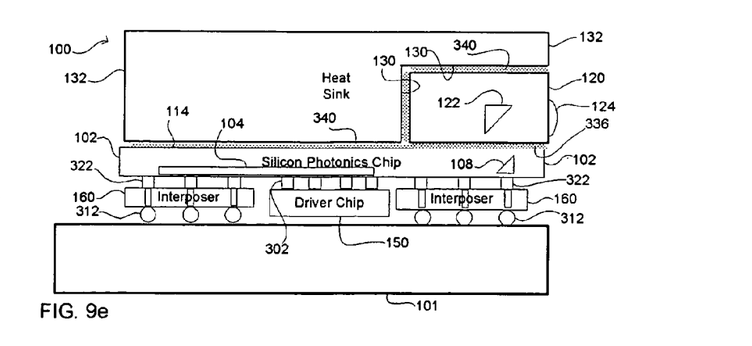

A heat sink such as the heat sink 132, may be assembled (block 340, FIG. 8) to the optical coupler 120 and to the back side 114 of the photonic device 102 as shown in FIG. 9*e*. In the illustrated embodiment, a thermal adhesive layer 340 which facilitates transfer of thermal energy from the photonic die 102 and the optical coupler 120 may be used to affix the heat sink 132 to the portion of the back side 114 of the photonic die 102 which is not occupied by the optical coupler 120. The adhesive layer 340 may also extend between the heat sink 132 and the optical coupler 120 which is received within the cavity 130 of the heat sink 132. In one embodiment, the adhesive material of the adhesive layer 340 may have metallic particles to facilitate transfer of heat energy. It is appreciated that other techniques may be used to affix the heat sink 132 to the optical coupler 120 and to the back side 114 of the photonic die in such a manner to facilitate drawing heat energy from the photonic die 102 and the optical coupler 120.

Figure 12A:
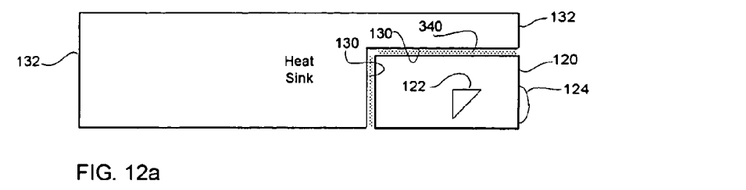
FIGS. 12a-12d are schematic cross-sectional diagrams illustrating the operations of FIG. 11 for assembling a photonic package in accordance with the present description.
Figure 12B:
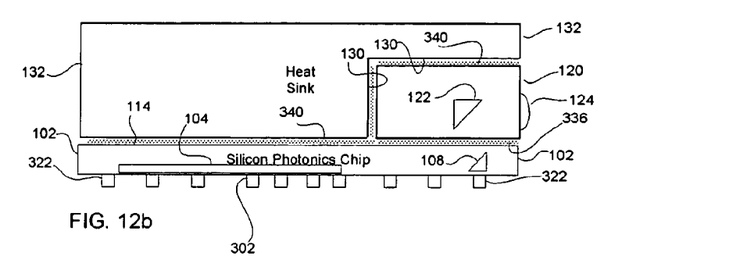

It is further appreciated that the components of a photonic package in accordance with the present description may be assembled in other manners and orders, depending upon the particular application. For example, FIG. 11 and FIGS. 12*a*-12*d* depict another embodiment of operations to assemble a photonic package such as the package 100 of the illustrated embodiment. In one operation, a heat sink such as the heat sink 132 and an optical coupler, such as the optical coupler 120 are assembled (block 400, FIG. 11) as shown in FIG. 12*a* using a layer 340 of thermal adhesive. The heat sink and optical coupler assembly may be assembled block 410, FIG. 11) to the back side 114 of the photonic die 102 as shown in FIG. 12*b*. The layer 340 of thermal adhesive may be extended between the heat sink 132 and the back side 114 of the photonic die 102. An optically transparent adhesive layer 336 may be provided between the optical coupler 120 and the back side 114 of the photonic die 102.

Registration or other alignment features may be utilized to facilitate aligning the optical coupler and the photonic die, depending upon the particular application. The alignment features may be disposed on one or more of the heat sink, optical coupler and die. For example, the optical coupler 120 and the back side 114 of the photonic die 102 may be aligned using registration features such as male and female beveled die features 332 (FIG. 10) carried on the back side 114 of the photonic die 102, which are aligned with and mated with corresponding male and female beveled features 334 on the optical coupler 120. The heat sink and optical coupler assembly may be aligned with respect to each other in a similar manner. The heat sink (with the optical coupler attached) may be aligned with respect to the die in a similar manner.

Figure 12C:
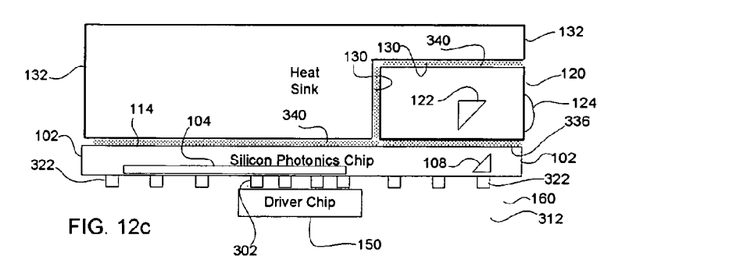

In another operation, the die-to-die stack of the photonic die 102 and the driver circuit die 150 may be assembled (block 430, FIG. 11) as depicted in FIG. 12*c*. The contact pads or other electrical contact features on front side of the photonic die 102 and the die 150 may be aligned and bonded together using suitable bonding techniques. For example, the electrical contact features of the die-to-die stack of the photonic die 102 and the driver circuit die 150 may be soldered using thermo-compression bonding as represented by the bonds 302 of FIG. 12*c*. The gap between the photonic die 102 and die 150 may optionally be under filled with a suitable under fill layer as appropriate for the particular application.

Figure 12D:
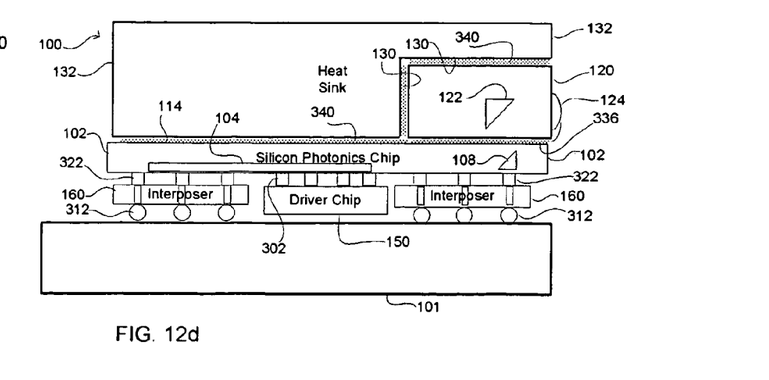

In another operation, the die-to-die stack of the photonic die 102 and the driver circuit die 150 (with the optical coupler 120 and the heat sink 132 affixed to the back side 114 of the photonic die 102) may be assembled (block 440, FIG. 11) onto an interposer such as the interposer 160 which has been preassembled onto the substrate 101 as depicted in FIG. 12*d*. The contact pads or other electrical contact features on front side of the photonic die 102 and the interposer 160 may be aligned and bonded together using suitable bonding techniques. For example, the electrical contact features of the interposer 160 and the die-to-die stack of the photonic die 102 and the driver circuit die 150 may be soldered using thermo-compression bonding as represented by the bonds 322 of FIG. 12*d*. Other bonding techniques may be used. The gap between the photonic die 102 and the interposer 160 may optionally be under filled with a suitable under fill layer as appropriate for the particular application.

Additional Embodiment Details

The described techniques for may be embodied as a method, apparatus, computer program product or article of manufacture using standard programming and/or engineering techniques to produce software, firmware, hardware, or any combination thereof. The outputs of on-die circuitry which may include programmable processors, dedicated processors, comparators or adder/subtractor circuits, may be processed by on-die logic circuitry, firmware or software or processed by off chip logic circuitry, firmware or software, or a combination thereof, to process optically transmitted data. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The "article of manufacture" or "computer program product" may comprise the medium in which the code is embodied. Additionally, the "article of manufacture" "computer program product" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, the photonic package embodiments may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the photonic package embodiments may be embodied in a computing device that does not include, for example, a video controller, such as a switch, router, etc, or does not include a network controller, for example.

The illustrated logic of FIGS. 8, 9a-9e, 11, 12a-12d shows certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

Figure 13:
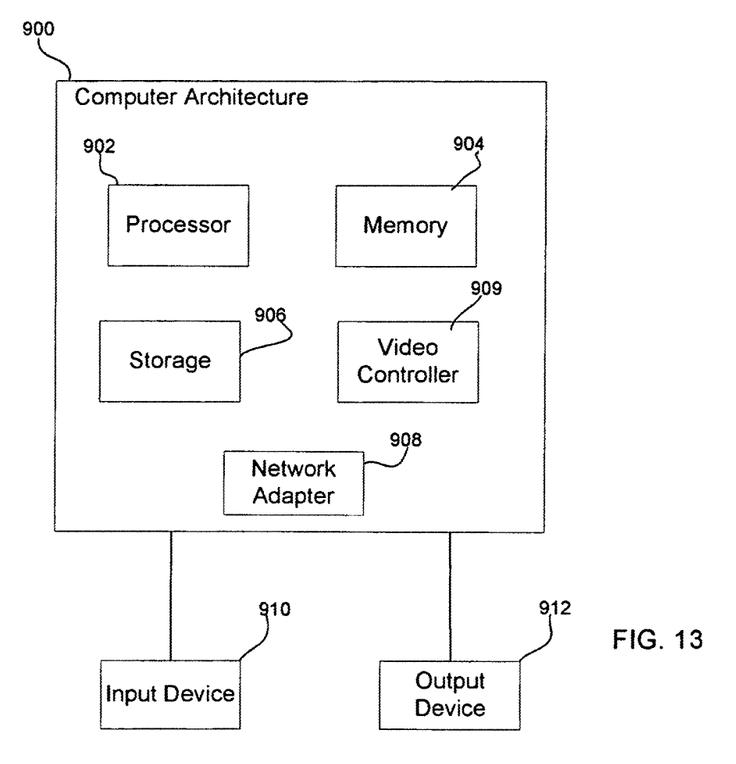
FIG. 13 illustrates an embodiment of a system utilizing a photonic package in accordance with the present description.

FIG. 13 illustrates one embodiment of a computer architecture 900 of components, any one of which may include a photonic package in accordance with the present description. The computer architecture 900 may comprise any computing device known in the art, such as a mainframe, server, personal computer, workstation, laptop, handheld computer, telephony device, network appliance, virtualization device, storage controller, etc. The architecture 900 may include a processor 902 (e.g., a microprocessor), a memory 904 (e.g., a volatile memory device), and storage 906 (e.g., a non-volatile storage, such as magnetic disk drives, optical disk drives, a tape drive, etc.). The storage 906 may comprise an internal storage device or an attached or network accessible storage. Programs in the storage 906 are loaded into the memory 904 and executed by the processor 902 in a manner known in the art. The architecture further includes a network controller or adapter 908 to enable communication with a network, such as an Ethernet, a Fibre Channel Arbitrated Loop, etc. Further, the architecture may, in certain embodiments, include a video controller 909 to render information on a display monitor, where the video controller 909 may be embodied on a video card or integrated on integrated circuit components mounted on the motherboard. An input device 910 is used to provide user input to the processor 902, and may include a keyboard, mouse, pen-stylus, microphone, touch sensitive display screen, or any other activation or input mechanism known in the art. An output device 912 is capable of rendering information transmitted from the processor 902, or other component, such as a display monitor, printer, storage, etc.

The network adapter 908 may embodied on a network card, such as a Peripheral Component Interconnect (PCI) card, PCI-express, or some other I/O card, or on integrated circuit components mounted on the motherboard. The storage 906 may comprise an internal storage device or an attached or network accessible storage. Programs in the storage 906 are loaded into the memory 904 and executed by the processor 902. Any one or more of the devices of the computer architecture 900 may include one or more integrated circuits having an on-die conversion testing circuit as described herein.

The foregoing description of various embodiments has been presented for the purposes of illustration and description. It is not intended to be exhaustive or to limit to the precise form disclosed. Many modifications and variations are possible in light of the above teaching.

What is claimed is:

1. A device, comprising:
   a first die of semiconductor material, said first die having circuitry including a photon emitter on the front side of the first die, and a beam path on the front side of the first die and positioned to direct a beam of photons from the photon emitter on the front side of the first die, through the semiconductor material of the body of the first die, and to the backside of the first die;
   a second die having a photon emitter driver circuit, said second die being coupled to the front side of the first die having the photon emitter, for driving the photon emitter;
   an optical coupler positioned at the backside of the first die to receive the beam of photons from the backside of the first die; and
   a heat sink thermally coupled to the backside of the first die, made of a heat drawing material and positioned to draw heat energy generated by circuitry including the photon emitter on the front side of the first die, wherein the heat sink defines a recess within the heat sink and the optical coupler is received in the heat sink recess.

2. The device of claim 1 wherein the beam path includes a first mirror on the front side of the first die and positioned to reflect a beam of photons from the photon emitter on the front side of the first die, through the semiconductor material of the body of the first die, and to the backside of the first die.

3. The device of claim 1 wherein the first die has integrated circuits including doped regions on the front side of the first die.

4. The device of claim 2 wherein the first mirror includes an etched beveled surface at the front side of the first die and a photon reflective metal on the beveled surface.

5. The device of claim 1 wherein the photon emitter is a laser.

6. The device of claim 1 wherein said the optical coupler includes a mirror positioned to reflect the beam of photons from the backside of the first die.

7. The device of claim 1 further comprising a layer of optically transmissive adhesive affixing the optical coupler to the backside of the first die.

8. The device of claim 6 wherein the optical coupler includes a lens positioned to focus the beam of photons reflected by the mirror of the optical coupler.

9. The device of claim 8 further comprising a fiber optic cable coupled to the optical coupler so that the fiber optic cable is positioned to receive the beam of photons focused by the lens of the optical coupler.

10. The device of claim 1 for use with a substrate, the device further comprising an interposer having a central aperture, said interposer coupled to the substrate.

11. The device of claim 10 wherein the front side of the first die having the photon emitter is coupled to the interposer with the second die disposed within the aperture of the interposer.

* * * * *